(12) United States Patent
Zhang et al.

(10) Patent No.: US 10,104,802 B2
(45) Date of Patent: Oct. 16, 2018

(54) SERVER RACK

(71) Applicant: HONGFUJIN PRECISION ELECTRONICS (TIANJIN) CO., LTD., Tianjin (CN)

(72) Inventors: Guang-Yi Zhang, Shenzhen (CN); Jia-Qi Fu, Shenzhen (CN); Hai-Chen Zhou, Shenzhen (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 15/485,386

(22) Filed: Apr. 12, 2017

(65) Prior Publication Data

US 2018/0184541 A1 Jun. 28, 2018

(30) Foreign Application Priority Data

Dec. 23, 2016 (CN) .......................... 2016 1 1208239

(51) Int. Cl.
*H05K 7/00* (2006.01)
*H05K 7/14* (2006.01)

(52) U.S. Cl.
CPC ......... *H05K 7/1492* (2013.01); *H05K 7/1487* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 6,619,766 B1* | 9/2003 | Mansueto | G06F 1/184 312/223.1 |
| 2010/0172087 A1* | 7/2010 | Jeffery | G11B 33/02 361/679.33 |
| 2012/0243170 A1* | 9/2012 | Frink | G06F 1/187 361/679.34 |
| 2013/0120927 A1* | 5/2013 | Wen | G06F 1/187 361/679.39 |

* cited by examiner

*Primary Examiner* — Courtney Smith
*Assistant Examiner* — Rashen E Morrison
(74) *Attorney, Agent, or Firm* — ScienBiziP, P.C.

(57) ABSTRACT

A server rack includes a shell and a plurality of brackets configured to receive a plurality of data storages. The data storages are electrically connected to the bracket. The shell includes a power supply module configured to provide power to the data storages, and an adapter plate connected with the power supply module through a cable. The bracket is electrically connected to a connecting device. When the bracket is slid in the shell, the connecting device closely contacts the adapter plate to be electrically connected with the adapter plate, and the data storages are thus electrically connected with the power supply module.

14 Claims, 6 Drawing Sheets

SERVER RACK

CROSS-REFERENCE TO RELATED APPLICATIONS

This application claims priority to Chinese Patent Application No. 201611208239.3 filed on Dec. 23, 2016 the contents of which are incorporated by reference herein.

FIELD

The subject matter herein generally relates to a server rack.

BACKGROUND

The server generally needs hot-swappable hard drive. Therefore, a server rack must receive the hard disk, and the server rack is equipped with slide rails to conveniently slide the hard drive into the rack.

BRIEF DESCRIPTION OF THE DRAWINGS

Implementations of the present technology will now be described, by way of example only, with reference to the attached figures.

DETAILED DESCRIPTION

Figure 1:
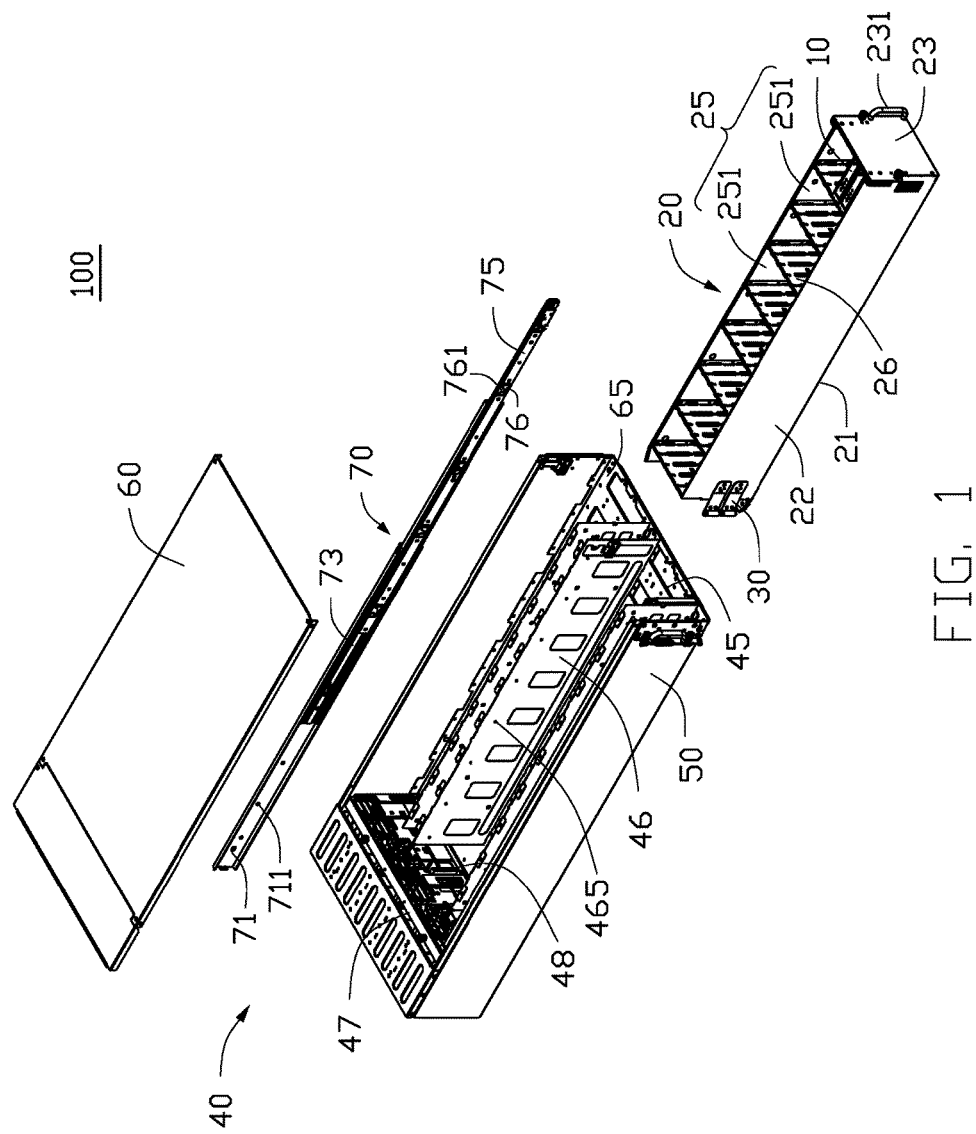
FIG. 1 is an exploded view of an exemplary embodiment of a server rack and a plurality of data storages.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "outside" refers to a region that is beyond the outermost confines of a physical object. The term "inside" indicates that at least a portion of an object is contained within a boundary formed by another object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 illustrates one exemplary embodiment of a server rack 100 for receiving a plurality of data storages 10. The server rack 100 includes a plurality of brackets 20 configured to receive the data storages 10 and a shell 40 configured to receive the brackets 20. The data storages 10 are received in the brackets 20 and electrically connected with the brackets 20.

Figure 2:
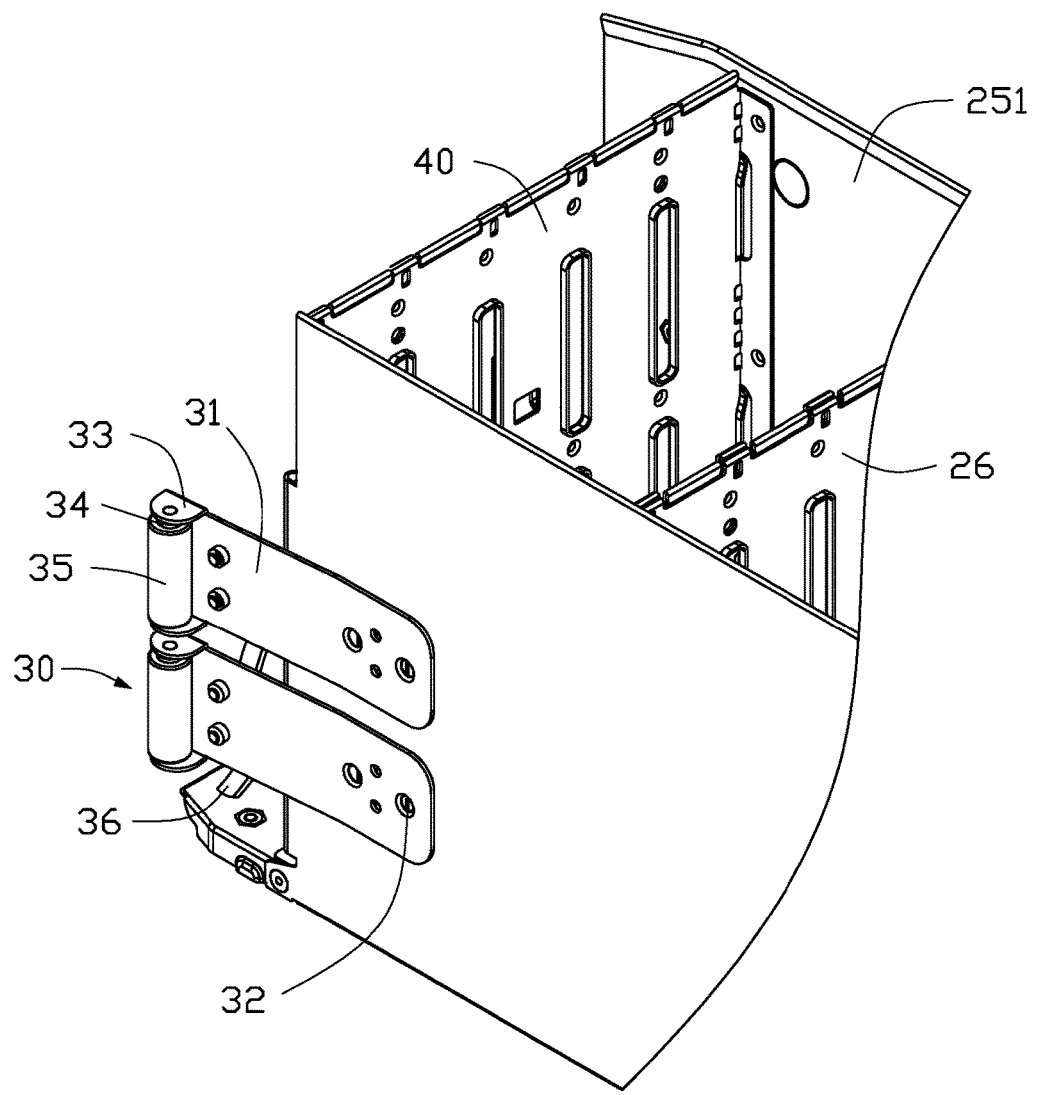
FIG. 2 is an assembled view of a connecting device of the server rack of FIG. 1.

FIG. 1 and FIG. 2 illustrate that the bracket 20 includes a bottom wall 21, two sidewalls 22 connected with both sides of the bottom wall 21, a front wall 23 connected with the front end of the bottom wall 21, and a rear wall 24 connected with the rear end of the bottom wall 21. The bottom wall 21, the two sidewalls 22, the front wall 23, and the rear wall 24 together define a receiving space 25 to receive the data storages 10.

The bracket 20 includes a plurality of baffles 26, and the baffles 26 are parallel to each other. Each end of each baffle 26 is perpendicular to the sidewall 22. The baffles 26 divide the receiving space 25 into a plurality of receiving portions 251, and each receiving portion 251 is configured to receive a plurality of data storages 10.

Figure 3:
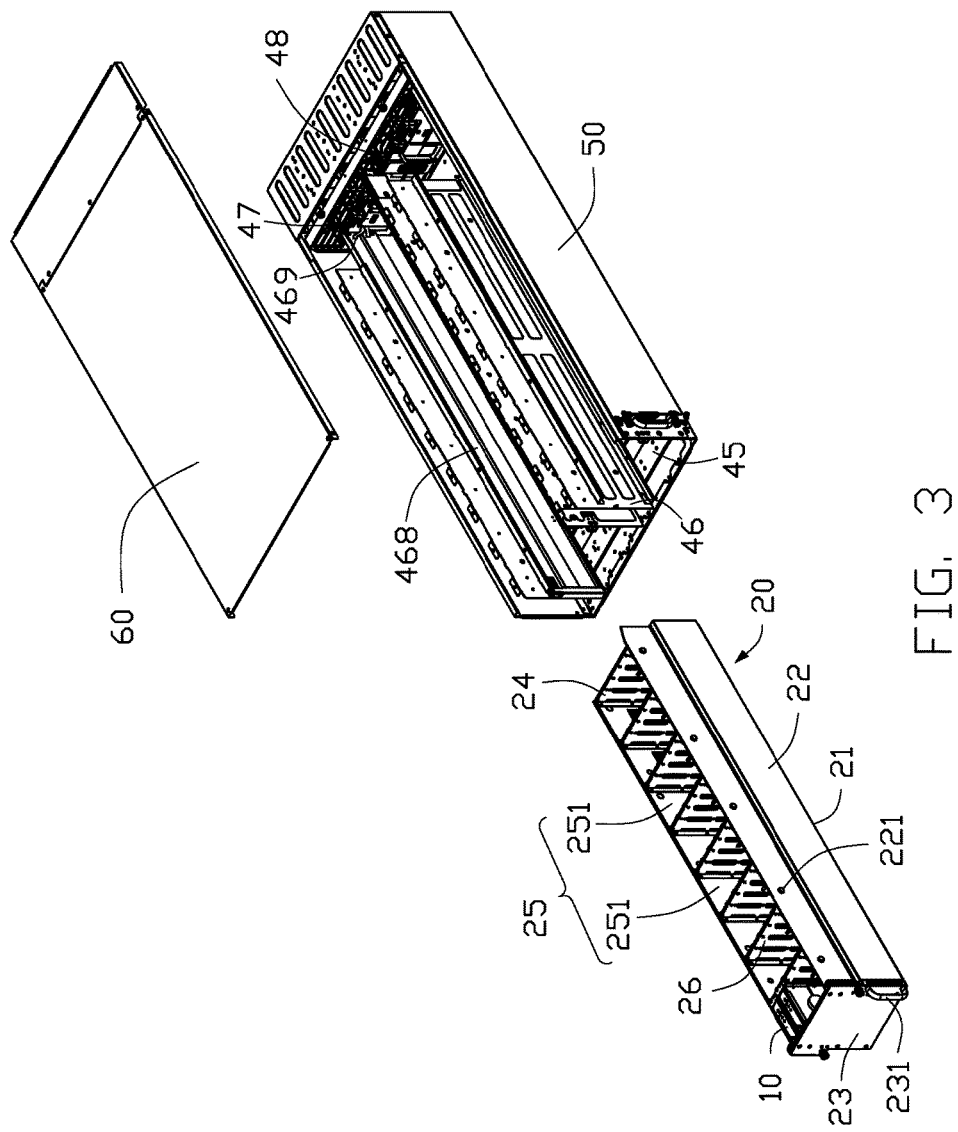
FIG. 3 is similar to FIG. 1, but viewed from another angle.

FIG. 3 illustrates that one of the sidewall 22 includes a plurality of fasteners 221, and each fastener 221 is secured on the server rack 100 to secure the bracket 20 on the server rack 100. The rear end of the other sidewall 22 includes two connecting devices 30. One side of the front wall 23 includes a handle 231 configured to pull or push the bracket 20. The rear wall 24 includes a plurality of electrical connectors (not shown). The electrical connectors are configured to transmit data and power.

Each connecting device 30 includes a connecting member 31 and a wheel 35 rotatably installed on the connecting member 31. One end of the connecting member 31 defines a plurality of securing holes 32. A plurality of securing members (not shown) passes through the securing holes 32 and is inserted into the sidewall 22 to secure the connecting member 31 on the bracket 20. The other end of the connecting member 31 includes two connecting plates 33. The two connecting plates 33 are perpendicularly connected with the connecting member 31 and parallel to each other. A connecting shaft 34 is secured between the two connecting plates 33. The wheel 35 can be set on the connecting shaft 34 and rotated relative to the connecting shaft 34. Each connecting device 30 is electrically connected with the bracket 20 by a cable 36.

FIG. 1 to FIG. 3 illustrate that the shell 40 includes a bottom plate 45, two side plates 50 connected with the both sides of the bottom plate 45, and a cover 60 connected with two side plates 50. The bottom plate 45, the front end of the side plate 50, and the cover 60 together define an opening 65. The bracket 20 can be inserted into the shell 40 through the opening 65.

The bottom plate 45 includes a plurality of mounting plates 46, and the mounting plates 46 are perpendicularly connected with the bottom plate 45 and parallel to the side plate 50. The top end of one of the mounting plate 46 defines a plurality of mounting holes 465. A plurality of fixing members (not shown) can be inserted into the mounting holes 465 to secure a slide rail module 70 on the mounting plate 46.

Figure 5:
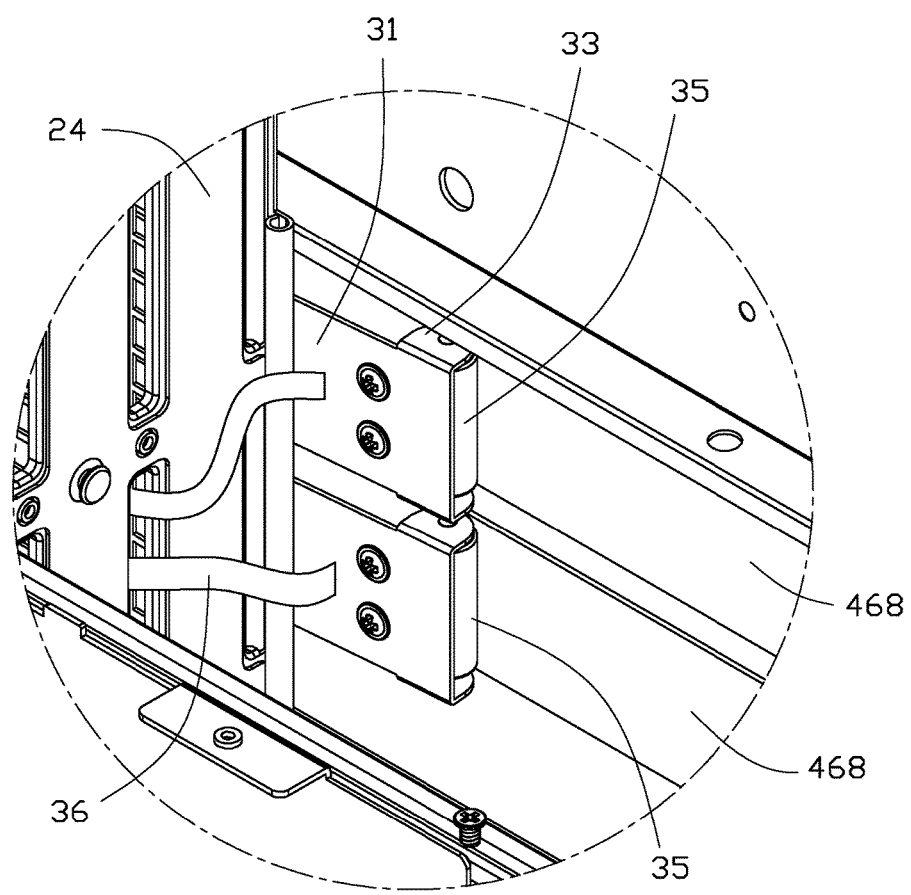
FIG. 5 is an enlarged view of circled area V in FIG. 4.

The other mounting plate 46 includes two adapter plates 468. The adapter plate 468 is made of a conductive material and is capable of conducting current. FIG. 5 illustrates that the wheel 35 of the connecting device 30 is in constant close contact with the adapter plate 468 to be electrically connected with the adapter plate 468.

The shell 40 includes a power supply module 47 at the rear end of the bottom plate 45. The power supply module 47 is configured to provide power to the data storages 10. The adapter plate 468 is equipped with a cable 469, and the adapter plate 468 is electrically connected with the power supply module 47 by the cable 469. The shell 40 includes a plurality of interfaces 48 at the rear end of the rear plate 45. The electrical connector of the bracket 20 is inserted into the interface 48 to connect the data storage 10 with a server.

In FIG. 1, the slide rail module 70 includes an outer rail 71, a middle rail 73 slidably installed on the outer rail 71, and an inner rail 75 slidably installed on the middle rail 73. The outer rail 71 defines a plurality of through holes 711. The fixing member (not shown) can pass through the through hole 711 and be inserted into the mounting hole 465 to secure the outer rail 71 on the mounting plate 46. The inner rail 75 is equipped with a plurality of latch members 76, and each latch member 76 is equipped with a latch groove 761. The fastener 221 can be mounted in the latch groove 761 to secure the bracket 20 on the inner rail 75.

Figure 4:
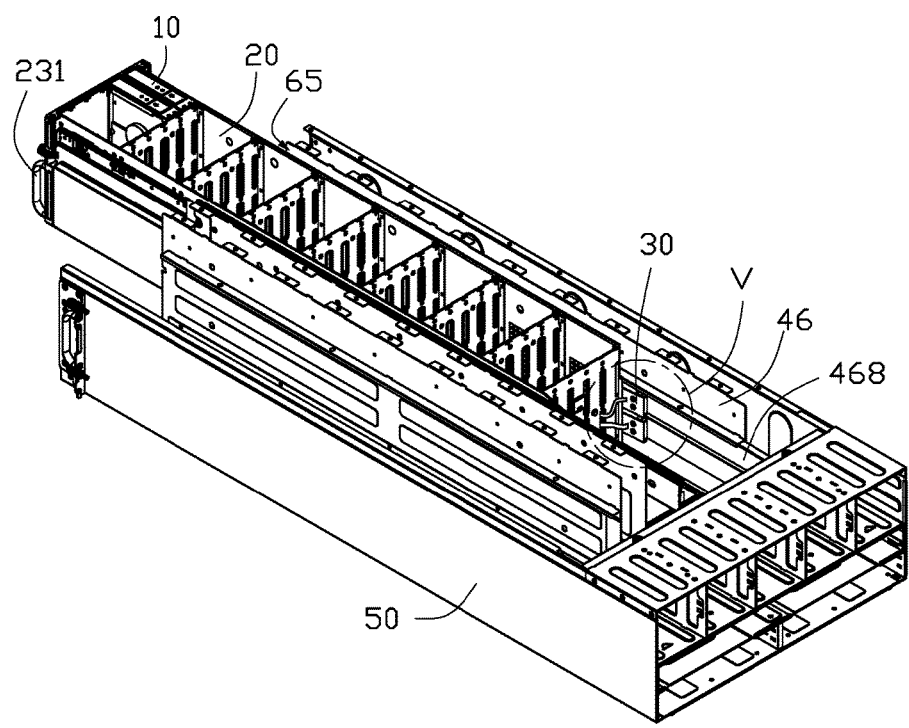
FIG. 4 is an assembled view of the server rack and the plurality of data storages of FIG. 1, but a cover is not shown.
Figure 6:
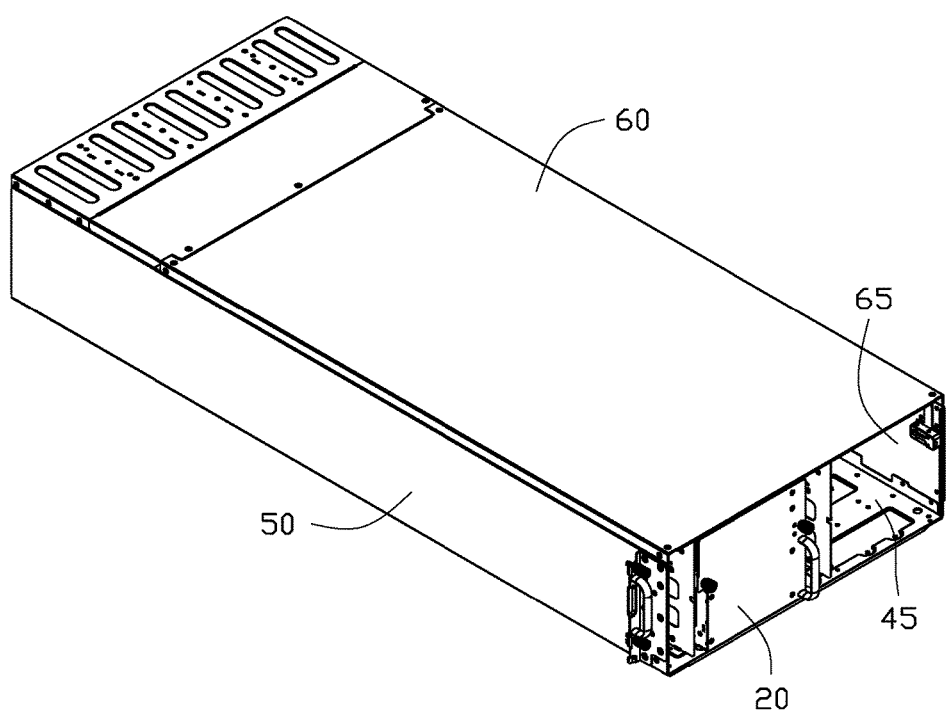
FIG. 6 is an assembled view of the server rack and the plurality of data storages of FIG. 1.

FIGS. 4 to 6 illustrate assembly of the server rack 100. The mounting plate 46 is secured on the bottom plate 45, and the securing member passes through the through hole 711 of the outer rail 71 and is inserted into the mounting hole 465 to secure the slide rail module 70 on the mounting plate 46. The adapter plate 468 is secured on the other mounting plate 46 and the extension of the connecting plate 468 is parallel to the bottom plate 45. The power supply module 47 is secured on the rear end of the bottom plate 45, and the cable 469 of the adapter plate 468 is electrically connected with the power supply module 47. The cover 60 is secured on the top end of the side plates 50. Thus, the shell 40 is assembled.

The wheel 35 is set on the connecting shaft 34 of the connecting member 31 as shown in FIG. 2. The ends of the connecting shaft 34 are inserted into the connecting plates 33. The connecting device 30 is located at the rear end of the one of the sidewalls 22, the securing member passes through the securing hole 32 and is inserted into the sidewall 22 to secure the connecting device 30 on the bracket 20. The cable 36 of the connecting device 30 is electrically connected with the bracket 20 to electrically connect the connecting device 30 with the bracket 20.

Referring to FIGS. 1 and 3, the data storages 10 are placed in the receiving portion 251 of the bracket 20 and are electrically connected with the bracket 20. The inner rail 75 and the middle rail 73 are slid out from the opening 65, and the fastener 221 of the sidewall 22 is latched on the latch groove 761 of the inner rail 75 to secure the bracket 20 on the slide rail 70. The wheel 35 of the connecting device 30 is in constant close contact with the adapter plate 468, to be electrically connected with the adapter plate 468.

The bracket 20 is pushed to slide the inner rail 75 into the middle rail 73, and the middle rail 75 is slid into the outer rail 75. When the bracket 20 passes through the opening 65 and is received in the server rack 100, the electrical connector of the rear wall 24 connects with the interface 48. Then, the data storage 10 and the bracket 20 are slidably installed on the server rack 100.

FIGS. 4 and 5 illustrate removal of the bracket 20 from the shell 40. The handle 231 of the bracket 20 is pulled and the bracket 20 is slid out of the opening 65. The wheel 35 is rolled along the adapter plate 468 to electrically connect with the adapter 468 and the data storage 10 thus remains electrically connected with the power supply module 47 through the cable 36 and the cables 469 (shown in FIG. 3) during the sliding process. Loss of power or other connection to the data storage 10 is thus prevented.

The exemplary embodiments shown and described above are only examples. Many details are often found in the art such as the other features of a server rack. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A server rack, comprising:
a shell, comprising an adapter plate and a power supply module configured to provide power to a plurality of data storages; and
a plurality of brackets electrically connected with the shell;
wherein the adapter plate is connected with the power supply module through a cable, the bracket is electrically connected with a connecting device, when the bracket is slid into the shell, the connecting device is in close contacted with the adapter plate to be electrically connected with the adapter plate, and the data storages are electrically connected with the power supply module;
wherein the shell comprises two sidewalls, and a plurality of securing members securing the connecting device on a rear end of one of the sidewalls; the connecting device comprises a connecting member, the securing members pass through one end of the connecting member close to the sidewall close to the adapter plate and are inserted into the sidewall close to the adapter plate to secure the connecting device on the bracket; the connecting device further comprises a wheel rotatably installed on one end of the connecting member, and the wheel is in close contacted with the adapter plate and rolls relative to the adapter plate.

2. The server rack of claim 1, wherein one end of the connecting member comprises two connecting plates, a connecting shaft is installed between the two connecting plates, and the wheel is configured to be set on the connecting shaft to rotatably installed on the connecting member.

3. The server rack of claim 1, wherein the shell comprises a bottom plate and a plurality of mounting plates connected with the bottom plate, and the adapter plate is mounted on the mounting plate.

4. The server rack of claim 3, wherein a slide rail module is mounted on the one of the mounting plate, and the bracket is mounted on the slide rail module to be installed and slid on the shell.

5. The server rack of claim 4, wherein the slide rail module comprises an outer rail, the outer rail defines a plurality of through holes, the mounting plate defines a plurality of mounting holes, a plurality of securing members pass through the through holes and are inserted into the mounting holes to secure the outer rail on the mounting plate.

6. The server rack of claim 5, wherein the slide rail module comprises a middle rail slidably installed in the outer rail and an inner rail slidably installed in the middle rail, the bracket is secured on the inner rail.

7. The server rack of claim 6, wherein the inner rail comprises a plurality of latch members, each latch member defines a latch groove, one of the sidewalls of the bracket defines a plurality of fasteners, and the fasteners are secured on the latch grooves to secure the bracket on the inner rail.

8. An electronic device, comprising:
a plurality of data storage module; and
a server rack, comprising:
a shell, comprising an adapter plate and a power supply module configured to provide power to the data storages; and
a plurality of brackets electrically connected with the shell;
wherein the adapter plate is connected with the power supply module through a cable, the bracket is electrically connected with a connecting device, when the bracket is slid in the shell, the connecting device is in close contacted with the adapter plate to be electrically connected with the adapter plate, and the data storages are electrically connected with the power supply module;
the shell comprises two sidewalls, and a plurality of securing members securing the connecting device on a rear end of one of the sidewall; the connecting device comprises a connecting member, the securing members pass through one end of the connecting member close to the sidewall close to the adapter plate and are inserted into the sidewall close to the adapter plate to secure the connecting device on the bracket; the connecting device comprises a connecting member and a wheel rotatably installed on one end of the connecting member, and the wheel is in close contacted with the adapter plate and rolls relative to the adapter plate.

9. The electronic device of claim 8, wherein one end of the connecting member comprises two connecting plates, a connecting shaft is installed between the two connecting plates, and the wheel is configured to be set on the connecting shaft to rotatably installed on the connecting member.

10. The electronic device of claim 8, wherein the shell comprises a bottom plate and a plurality of mounting plates connected with the bottom plate, and the adapter plate is mounted on the mounting plate.

11. The electronic device of claim 10, wherein a slide rail module is mounted on the one of the mounting plate, and the bracket is mounted on the slide rail module to be installed and slid on the shell.

12. The electronic device of claim 11, wherein the slide rail module comprises an outer rail, the outer rail defines a plurality of through holes, the mounting plate defines a plurality of mounting holes, a plurality of securing members pass through the through holes and are inserted into the mounting holes to secure the outer rail on the mounting plate.

13. The electronic device of claim 12, wherein the slide rail module comprises a middle rail slidably installed in the outer rail and an inner rail slidably installed in the middle rail, the bracket is secured on the inner rail.

14. The electronic device of claim 13, wherein the inner rail comprises a plurality of latch members, each latch member defines a latch groove, one of the sidewall of the bracket defines a plurality of fasteners, and the fasteners are secured on the latch grooves to secure the bracket on the inner rail.

* * * * *